United States Patent
Curran et al.

(10) Patent No.: US 12,252,799 B2
(45) Date of Patent: Mar. 18, 2025

(54) ANODIC OXIDE COATING WITH HIGH TEMPERATURE TOLERANCE

(71) Applicant: Apple Inc., Cupertino, CA (US)

(72) Inventors: James A. Curran, Sunnyvale, CA (US); Kar-Wai Hon, Taipei (TW); Todd S. Mintz, San Jose, CA (US); Isabel Yang, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 18/316,530

(22) Filed: May 12, 2023

(65) Prior Publication Data

US 2024/0229288 A1 Jul. 11, 2024

Related U.S. Application Data

(60) Provisional application No. 63/479,137, filed on Jan. 9, 2023.

(51) Int. Cl.
*H05K 5/04* (2006.01)
*C23C 28/00* (2006.01)
*C25D 11/08* (2006.01)
*C25D 11/10* (2006.01)
*C25D 11/24* (2006.01)

(52) U.S. Cl.
CPC ............ *C25D 11/246* (2013.01); *C23C 28/00* (2013.01); *C23C 28/345* (2013.01); *C25D 11/08* (2013.01); *C25D 11/10* (2013.01); *H05K 5/04* (2013.01)

(58) Field of Classification Search
CPC ................................ C23C 28/345; H05K 5/04
USPC ........................................................ 428/472.2
See application file for complete search history.

(56) References Cited

U.S. PATENT DOCUMENTS

2018/0263130 A1* 9/2018 Curran ................... G06F 1/1656
2019/0382911 A1* 12/2019 Curran ................... B32B 15/017

\* cited by examiner

*Primary Examiner* — Katherine A Christy
(74) *Attorney, Agent, or Firm* — Dorsey & Whitney LLP (57) ABSTRACT

An enclosure for an electronic device includes a titanium-aluminum clad substrate and an anodic oxide coating disposed on the titanium-aluminum clad substrate. The anodic oxide coating includes a density of between about 2.1 g/cm³ and about 2.4 g/cm³ or includes a maximum porosity between about 21% and about 31% and can be exposed to a temperature of over 150° C. without cracking or crazing.

13 Claims, 6 Drawing Sheets

ANODIC OXIDE COATING WITH HIGH TEMPERATURE TOLERANCE

CROSS-REFERENCE TO RELATED APPLICATION(S)

This claims priority to U.S. Provisional Patent Application No. 63/479,137, filed 9 Jan. 2023, and entitled "ANODIC OXIDE COATING WITH HIGH TEMPERATURE TOLERANCE," the entire disclosure of which is hereby incorporated by reference.

FIELD

The described embodiments relate generally to anodized films and method for forming the same. More particularly, the present embodiments relate to anodic oxides formed on substrates containing aluminum, the oxides having resistance to high temperature thermal processing.

BACKGROUND

The surfaces of many products in the commercial and consumer industries can be treated by any number of processes to alter the surface and create a desired effect, either functional, cosmetic, or both. One example of such a surface treatment is the anodizing of a metal substrate. Anodizing converts a portion of the metal substrate into a metal oxide, thereby creating a metal oxide layer, which is generally harder than the underlying metal substrate and can act as a protective layer. An anodizing method, often referred to as "Type II" anodizing, has been found to provide metal oxide layers with good corrosion and wear resistance for many consumer products.

While Type II anodic oxides are cosmetically appealing and can be dyed a wide range of colors, typical sealed Type II anodic oxides can develop cracks when exposed to temperatures of about 80° C. or higher, an effect known as "crazing." In other words, "Crazing" is visually perceptible cracking of an anodic oxide coating. After an exposure to about 150° C. the Type II oxides can be crazed and the high density of the cracks can result in poor corrosion protection for the underlying substrate, particularly in corrosive environmental exposures. Consequently, a more robust anodic oxide is needed.

SUMMARY

In some examples, an enclosure for an electronic device can include a titanium-aluminum clad substrate and an anodic oxide coating disposed on the titanium-aluminum clad substrate. The anodic oxide can include a density of between about 2.1 g/cm$^3$ and about 2.4 g/cm$^3$, or can include a maximum porosity between about 21% and about 31%. In some examples, the anodic oxide coating can include a thickness between about 5 μm and about 10 μm. The anodic oxide coating can be sealed with nickel acetate. In some examples, the anodic oxide coating can include a nickel concentration no greater than 0.08% by weight. The titanium-aluminum clad substrate can include a 6000-series or 7000-series aluminum alloy. In some examples, the anodic oxide coating can include a hardness value of 400 HV$_{0.05}$ or greater. The anodic oxide coating can be free of crazing after a thermal exposure of at least 150° C. In some examples, the enclosure can further include a vapor deposition coating deposited on the anodic oxide coating. In some examples, the anodic oxide can include a density of about 2.3 g/cm$^3$ or a coating mass of about 24 mg/dm$^{-2}$μm$^{-1}$.

According to some examples, a housing can include a substrate having aluminum and an anodic oxide disposed on the substrate, the anodic oxide including a hardness value of 450 HV$_{0.05}$ or greater. In some examples, the anodic oxide can include a dye. The anodic oxide can be sealed with nickel acetate. In some examples, the anodic oxide has a color of −1<a*<1 and −1<b*<1 as measured in accordance with CIE 1976 L*a*b* color space.

According to some examples, a method for forming an oxide coating includes forming an anodic oxide coating by anodizing a substrate comprising aluminum in an electrolyte using a current density between about 1.0 A/dm$^2$ and about 2.0 A/dm$^2$ and an anodizing temperature of less than about 20° C. The anodic oxide can include a surface harness value between about 450 HV$_{0.05}$ and about 550 HV$_{0.05}$. In some examples, the anodic oxide coating comprises a thickness between about 5 μm and about 10 μm. The electrolyte can include about 5-250 g/L of sulfuric acid. In some examples, the electrolyte can include about 5-100 g/L of organic acid. The organic acid can include at least one of oxalic acid, glycolic acid, tartaric acid, malic acid, citric acid, or malonic acid. In some examples, the electrolyte can include a mixture of about 100 g/L sulfuric acid and about 20 g/L of an organic acid. In some examples, the method also includes sealing the anodic oxide coating with nickel acetate.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to anodizing processes that result in cosmetically appealing and durable anodic oxide films. The anodizing processes described herein can be used as alternatives to conventional Type II anodizing processes, which have been found to cause certain defects when exposed to elevated temperatures. Typical or conventional Type II anodic oxides that are sealed are known to develop cracks that extend through the entire thickness of the oxide film coating when exposed to temperatures of about 80° C. or higher, which is known as crazing. After exposure to about 150° C., the coatings are typically severely crazed and the high density of the cracks extending through the oxide can result in poor corrosion protection for the underlying substrate. In some examples, the cracks can be about 1 μm wide.

In some examples, the degree of crazing can be minimized by reducing the thickness of the anodic oxide. However, lower oxide coating thickness can provide less corrosion protection to the aluminum substrate. A thickness of at least 5 microns (μm), and preferably between about 5 μm and about 10 μm can provide sufficient corrosion protection of an aluminum alloy in an expected in-service environmental exposure. For a titanium-aluminum clad enclosure, the galvanic coupling with the titanium emphasizes the need for good corrosion protection of the aluminum, and hence for a relatively thick, un-crazed, and defect-free oxide coating.

These and other embodiments are discussed below with reference to FIGS. 1-4. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

While the present can be applied to any substrate including aluminum, they are of particular relevance to clad enclosures or housings and also certain alloys, such as the 6000 and 7000 series aluminums. A fully sealed anodic oxide coating has been developed that is sufficiently tough to resist exposure to temperatures of about 150° C. without crazing, even when the oxide includes a thickness of about 5 μm or 10 μm.

Figure 1:
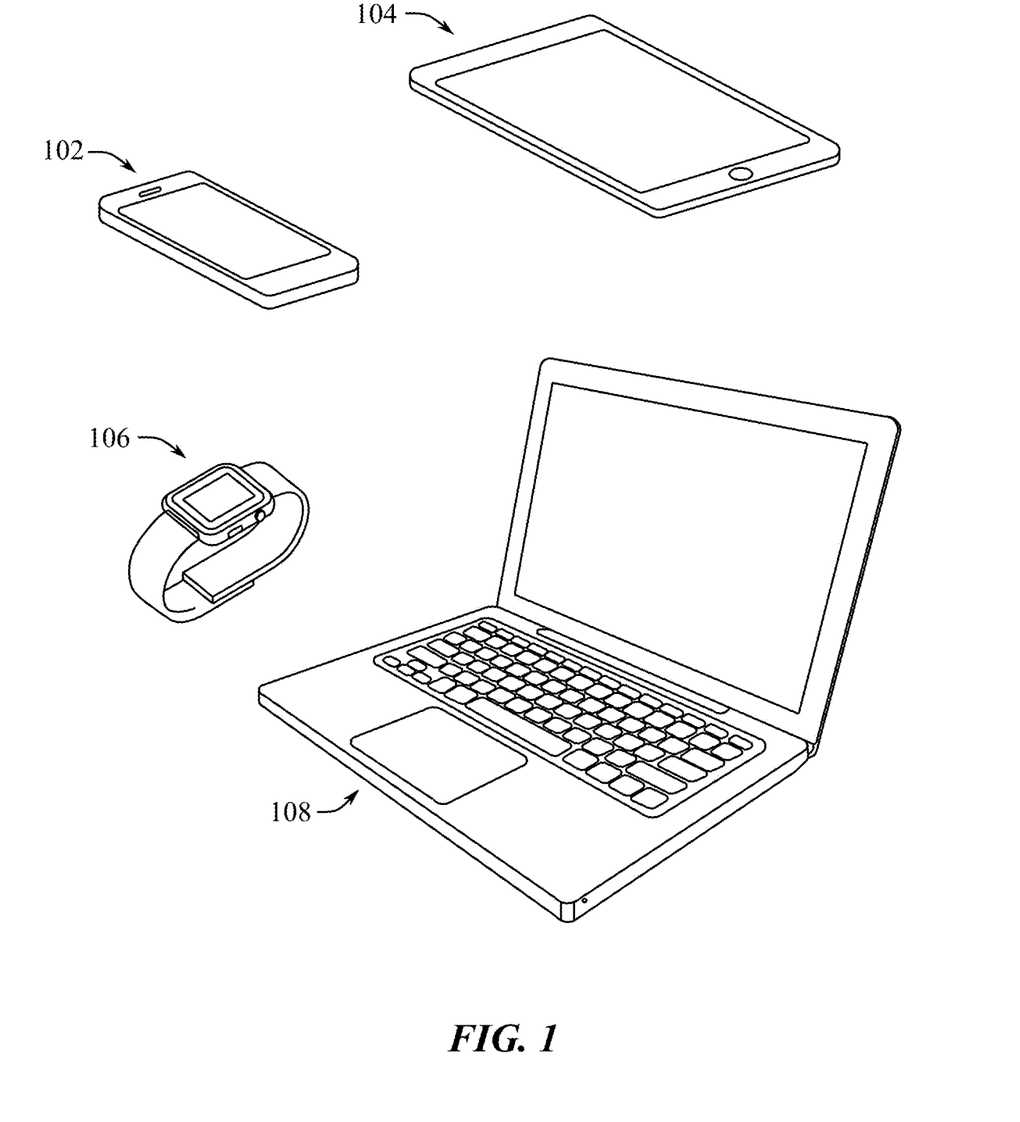
FIG. 1 shows example electronic devices that can include the housings and enclosures with anodic oxide coatings described herein.

Methods described herein can be used to form anodic oxide coatings that are resistant to higher temperatures as well as cosmetically appealing for surfaces of enclosures and/or housings for consumer devices. FIG. 1 shows consumer products than can be manufactured using methods described herein. FIG. 1 includes portable phone 102, tablet computer 104 and portable computer 106, which can each include enclosures and/or housings. The devices 102, 104 and 106 can be subject to impact forces such as scratching, dropping, abrading, chipping and gouging forces during normal use and can be subjected to conditions that are known to cause corrosion to aluminum, aluminum alloy, and titanium-aluminum clad components.

Certain alloys (such as 6000-series and 7000-series aluminum) are selected for making the enclosures of such devices, often driven by demands such as high strength and hardness. Metal surfaces of devices 102, 104 and 106 are typically anodized in order to add a protective anodic oxide coating to these metal surfaces. However, it has been found that use of conventional Type II anodizing process can cause visual defects on these anodized surfaces, detracting from the aesthetic appeal of devices 102, 104 and 106 and are not able to withstand higher processing temperatures as utilized by some manufacturing conditions and/or procedures. These defects can be particularly severe with higher strength or hardness alloys. If the metal surfaces are highly processed, these defects can be even more apparent.

In some examples, the aluminum surfaces can be predominantly internal to the system. However, the architecture of the enclosure can also include certain areas of the aluminum substrate and anodic oxide be exposed to the external environment, for buttons, as an example. Therefore, an important characteristic for an anodic oxide coating of an enclosure and/or housing is that it has a good cosmetic appearance. Even when the substrate is internal to the device, designers may insist that the coating have a bright silver "non-dyed aluminum" finish, or to be dyed to a specific target color. In some examples, the anodic oxide includes a cosmetic standard matching those of a typical "Type II" anodic oxide (as per Mil spec A-8625).

The anodizing methods described herein can be applied to substrates made of any suitable anodizable material. Although particular reference is made to 6000 and 7000-series aluminum alloys, and to clad substrates that can include aluminum, aluminum alloys and titanium, the method could be applied to other aluminum alloys where similar mechanisms of oxide formation occur, or where cracking and/or crazing of alloying elements weakens an anodic oxide and further causes pitting and/or galvanic corrosion. As described herein, the terms "anodic film," "anodic oxide," "anodic layer," "anodic oxide," "anodic oxide film," "anodic oxide layer," "anodic oxide coating" "metal oxide," "metal oxide film," "metal oxide layer," and "anodic coating" can be used interchangeably.

Figure 2A:
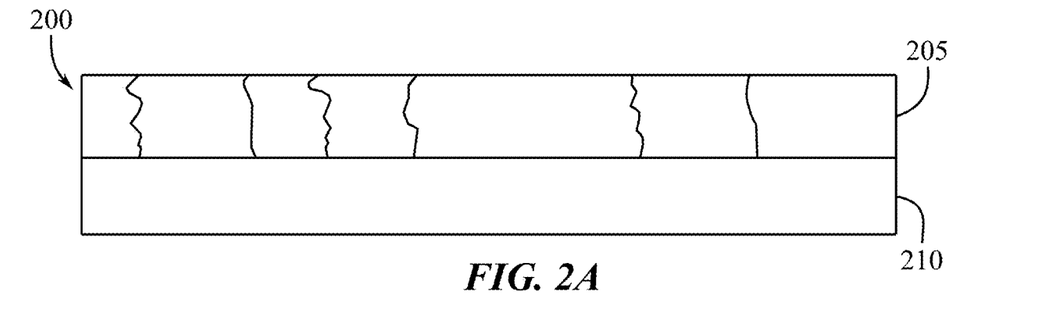
FIG. 2A shows a cross section view of an enclosure with a crazed oxide coating.

Referring to FIG. 2A, an enclosure 200 can include an anodic oxide 205 disposed on a substrate 210. For a typical 10 μm thick Type II anodic oxide 205 ("Type II" as defined in MIL A-8625F), the onset of cracking or crazing is found to be at about 80° C. As the temperature is raised further, more cracks form and the spatial density of cracks progressively increases. At an exposure to about 150° C., the crazing is found to typically include about 5-10 cracks per mm.

The cracks that form as the temperature is raised can generally bridge the entire thickness of the anodic coating 205, and whilst very minor cracks (e.g., with a crack density of less than 0.2 crack per mm) can "self-heal" (presumably due to the same oxide hydration mechanism which is responsible for sealing or "natural ageing" of the pore structure of the oxide), moderate (e.g., about 1 crack per mm) and severe (e.g., greater than 10 per mm) crazing does not self-heal. As such, permanent cracks that extend through the entirety of the thickness of the anodic coating 205 remain. These cracks can have about 1-2 μm widths. The cracks can provide an open path for corrosive media such as sweat, seawater, and/or tap-water to reach the underlying aluminum substrate 210 and cause pitting and/or galvanic corrosion.

The level of corrosion protection offered by the anodic oxide 205 can be assessed by chemical and environmental exposure tests, such as ASTM B-117 salt spray exposure. The ASTM B-117 salt spray test uses a closed testing chamber in which a salt water (5% NaCl) solution is atomized by means of spray nozzles using pressurized air. The enclosure 200 can be continuously exposed to the same corrosive atmosphere inside the chamber, then evaluated after removal from the test environment. The test samples are generally inspected at regular intervals to monitor and record the degradation of the samples until either the client wants to terminate the test such as when corrosion has initiated or after the specified time has elapsed. The B-117 salt spray test is well-known, rather inexpensive, and easy to perform.

In some examples, other tests can be applied to the enclosure 200. The most aggressive accelerated test which the oxide coating 205 endured is a 72 h immersion in artificial sweat (pH 4.3-4.5) without any observable pitting. The anodic oxide coating 205 includes properties that enable the coating 205 to withstand exposure to water or other aqueous chemistries at temperatures of 80° C. or more for at least two hours, and subsequent exposure to temperatures of over 150° C. without thermally induced cracking or crazing. The anodic oxide coating 205 can confer adequate environmental protection to the underlying aluminum substrate 210 throughout its expected service life.

There can be a significant difference between the thermal expansion coefficients of substrates that include aluminum and their anodic oxides. For example, aluminum alloys can have a thermal expansion coefficient of approximately $23 \times 10^{-6}$ $K^{-1}$ and the anodic oxide of the alloy can have a thermal expansion coefficient of approximately $6 \times 10^{-6}$ $K^{-1}$. As temperature rises, the substrate metal expands more than the anodic oxide coating. The expansion places the coating under a tensile strain, which is proportionate to temperature. A sealed anodic oxide is brittle and cracks when it reaches a known level of tensile strain. This tensile strain limit (and the corresponding tolerance to elevated temperature) depends linearly on the coating thickness.

Figure 2B:
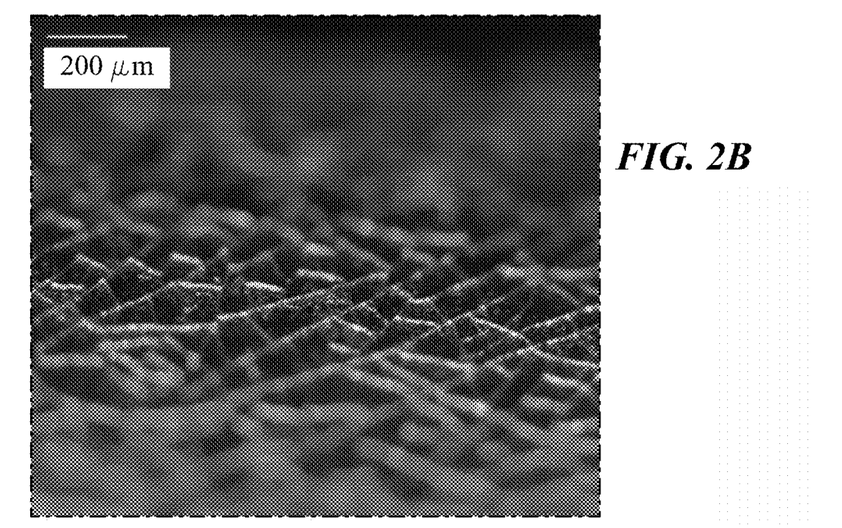
FIG. 2B shows a microscopic image of a severely crazed anodic oxide coating.

FIG. 2B shows a microscopic image of a severely crazed anodic oxide coating (e.g., anodic oxide coating 205). Crazing occurs when the oxide is strained beyond its tensile limit. It can be induced by either thermal exposure or by mechanical strain (e.g., any exposure to temperatures >75° C. may induce crazing). With a severely crazed oxide coating, an aluminum alloy (e.g., AA6013) can experience significant pitting corrosion in environmental exposures such as sweat and immersion in pool-water, tap-water, or salt-water.

High temperature exposure of the anodized aluminum may be unavoidable in certain manufacturing sequences. For example, in the manufacture of an enclosure for a consumer electronic device including a titanium-aluminum clad material (e.g., a Ti6AL4V clad to an AA6013), wherein one of the operations during the manufacture is the application of a physical vapor deposition (PVD) coating to the titanium for cosmetics and surface protection, the anodized aluminum may be subjected to temperatures of ~150° C. for several hours. This inevitably results in severe crazing of a typical sealed Type II anodic oxide that has a thickness of greater than 5 μm.

Crazing is sometimes only observed under specific lighting/observation conditions. In some examples, a dark and saturated dye color can hide crazing that would be observed in lighter colors. While light and moderate crazing may heal over hours or days, the cracks remain present and can be visible under SEM inspection. Light and moderate crazing may be a cosmetic defect but present no corrosion risk. However, most anodic coatings have thinner, imperceptible cracks at low densities. Severe crazing can result in a local loss of coating.

Figure 3A:
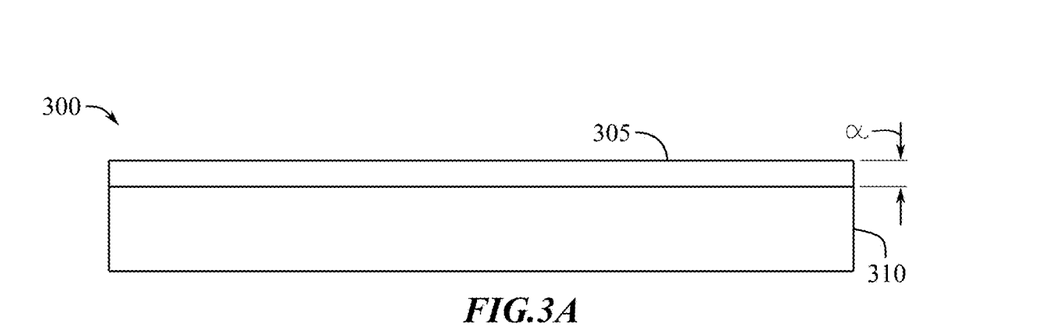
FIG. 3A shows a cross section view of an anodic oxide disposed on a substrate including aluminum.

FIG. 3A illustrates a cross section view of an enclosure 300 that includes an anodic oxide 305 disposed on a substrate 310. In some examples, the substrate 310 can include aluminum. In some examples, the enclosure 300 can be a housing for an electronic device. The anodic oxide 305 can be formed on the substrate 310 by anodizing the substrate 310 in an electrolyte, as described in greater detail below. The anodic oxide 305 forms a coating over the substrate 310 to provide corrosion protection and cosmetic benefits. In some examples, the anodic oxide 305 can include a thickness α between about 5 μm and about 10 μm. Anodization can have a duration in a range from about 30 minutes to about 60 minutes, or from about 35 to about 55 minutes, or from about 40 to about 50 minutes, or can be about 45 minutes. The thickness of the oxide layer 305 can be controlled in part by the duration of the anodization process. Anodic oxides are known to have a brittle characteristic, and a propensity to crack when they reach a certain level of tensile strain. The tensile limit and the corresponding tolerance to elevated temperature depends linearly on the thickness α of the anodic oxide 305.

The anodic oxide 305 may be dyed, but a dye is not necessary. For example, it may be left non-dyed to match the color of a natural titanium finish. In some examples, the anodic oxide coating 305 can be a clear and/or colorless anodic oxide coating 305. In some examples, the colorlessness of anodic oxide coating 305 is measured as having an a* of between −1 and 1 and a b* of between −1 and 1, as measured in accordance with CIE 1976 L*a*b* color space. This can be desirable in many cosmetic anodizing operations, where a clear anodic oxide coating 305 is preferred, either for use, or as a neutral base color for subsequent coloration using dyes.

In some examples, the anodic oxide 305 can be sealed with a nickel acetate. Pores are formed in the oxide layer during the anodization process, and can be spaced approximately 40-50 nanometers apart, for example. The diameter of each of the pores can range from 0.005 to about 0.05 microns, or from 0.01 to about 0.03 microns. The dimensions, however, are not intended to be limiting. In some examples, the anodic oxide 305 can include a mass of about 23 $mg/dm^2$ of surface area per micron of coating. The mass corresponds to a coating density of about 2.25 $g/cm^3$ prior to sealing. The density can increase to about 2.35 $g/cm^3$ upon sealing. This corresponds to a maximum porosity of about 26%. As such, the anodic oxide 305 can include a porosity between about 21% and about 31%. Sealing the surface can include sealing the pores of the oxide layer 305. In some examples, the anodic oxide coating 305 can include a nickel concentration no greater than 0.08% by weight.

Figure 3B:
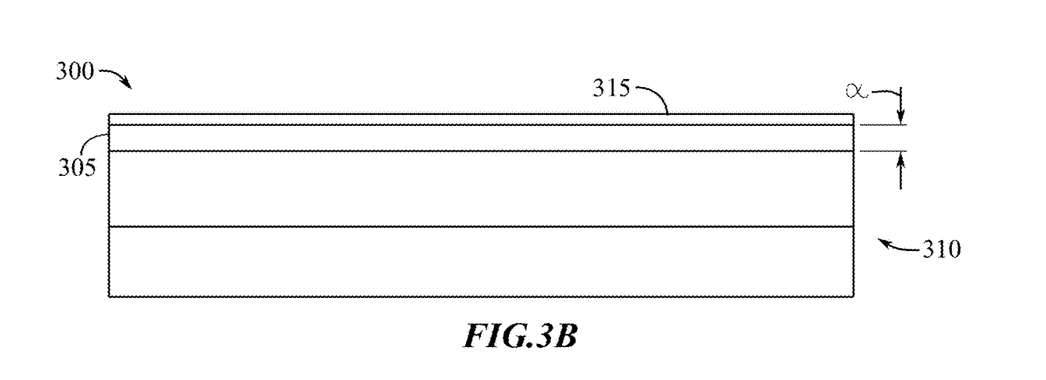
FIG. 3B shows a cross section view of an anodic oxide disposed on a titanium-aluminum clad substrate.

FIG. 3B shows a cross section view of the anodic oxide 305 disposed on a titanium-aluminum clad substrate 310. When the titanium-aluminum clad substrate 310 is included, additional processing demands exist. For example, the enclosure 300 can spend at least two hours in an aqueous cleaning and rinsing solution at temperatures of 80° C. or higher. The anodic oxide 305 can be tough enough to withstand a physical vapor deposition (PVD) coating. In some examples the PVD process occurs at about 140° C. A PVD coating 315, also known as thin-film coating, is a process in which a solid material is vaporized in a vacuum and deposited onto the surface of the anodic oxide 305. The PVD coating 315 is not just a metal layer. Instead, compound materials can be deposited atom by atom, forming a thin, bonded, metal or metal-ceramic surface layer that can improve the appearance, durability, and/or function.

Because of the titanium-aluminum clad substrate 310, if crazing occurs, the substrate 310 can be subjected to galvanic corrosion. Titanium ranks relatively high among naturally occurring metals in terms of corrosion resistance. However, even though titanium is resistant, in galvanic corrosion (also known as bimetallic corrosion), if two metals are coupled together, one will act as the anode and the other as the cathode when exposed to an electrolyte.

Figure 4A:
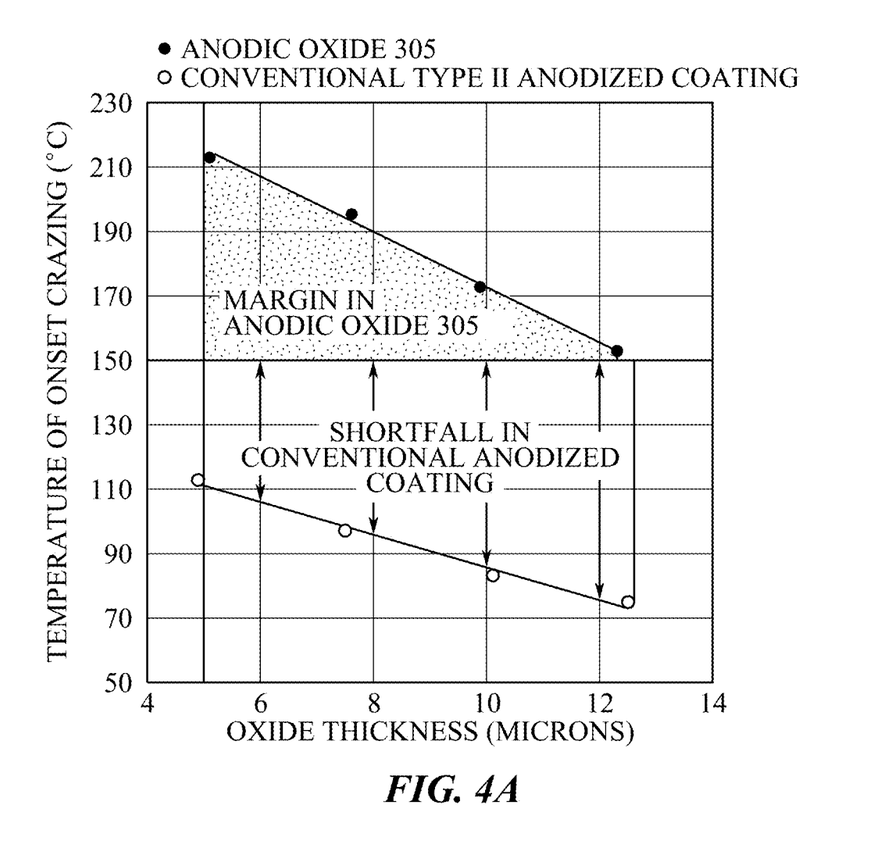
FIG. 4A shows a graphical representation of crack formation or crazing of an anodic oxide coating according to some examples described herein in comparison with crack formation of a conventional Type II anodic oxide coating.

FIG. 4A shows a graphical representation of crack formation or crazing of an anodic oxide coating according to some examples described herein in comparison with crack formation of a conventional Type II anodic oxide coating. The graph of FIG. 4A essentially shows the toughness of the anodic oxide coating of the present disclosure (e.g., anodic oxide 305) compared to a conventional Type II anodic oxide. The anodic oxide 305 includes a dense and hard coating compared to a conventional Type II anodic oxide. For example, per Mil A 8625F, Type II anodic oxides can include coating weights or between 1000 and 1728 mg per square foot for a coating of approximately 10 micron thickness (e.g., 10.8-18.6 mg/dm$^2$ per micron of coating thickness), whereas coating 305 can include a weight of approximately 2177 mg/ft$^2$ for an approximately 10 micron coating, or 23.5 mg/dm$^2$ per micron of coating thickness. In terms of hardness, the anodic oxide 305 can include a hardness value of about 400 $HV_{0.05}$ or greater. The conventional Type II anodic oxide includes a hardness value of about 250-350 $HV_{0.05}$.

As known in the art, $HV_{0.05}$ refers to a Vickers hardness testing scale, specifically at a load of 50 g. This may be measured on a polished surface, or directly on an anodized surface when that same has been formed on a polished substrate. It is recognized that at thicknesses of 10 micrometers or less, contributions from the substrate hardness will have an influence on the measured surface hardness, and the measured value may not reflect the true, absolute hardness of corresponding bulk material. However, throughout this paper, quoted hardness values are measured in the same way, allowing meaningful comparisons of relative hardness values.

Figure 4B:
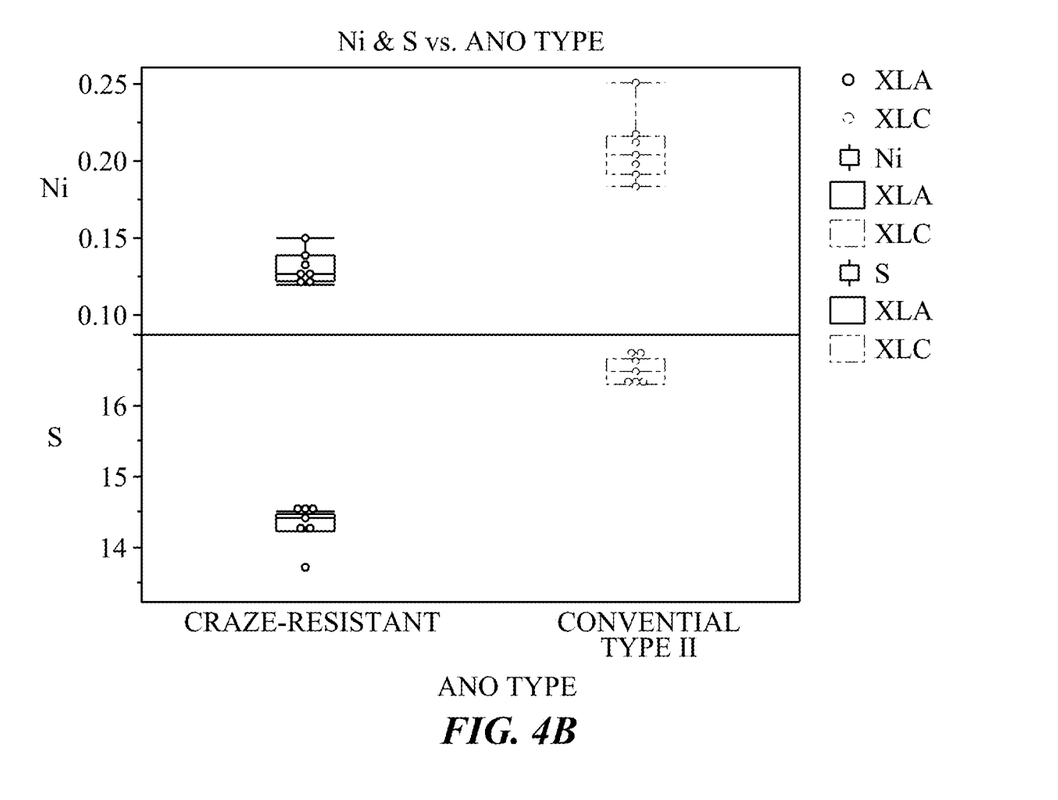
FIG. 4B shows a graphical representation of the composition according to x-ray fluorescence (XRF) analysis of an anodic oxide coating according to some examples described herein in comparison with a conventional Type II anodic oxide coating.

FIG. 4B shows a graphical representation of the composition according to x-ray fluorescence (XRF) analysis of an anodic oxide coating according to some examples described herein in comparison with a conventional Type II anodic oxide coating. It should be noted that the concentration calculations exclude oxygen, which is not measureable in XRF, and are therefore approximately double the actual wt % for any given element shown in FIG. 4B. In some examples, the anodic oxide (e.g., anodic oxide 305) can include a lower sulfur and a lower nickel content than conventional Type II anodized coatings. The difference can be from the reduced porosity of the anodic oxide. During anodization, the electrolyte can include about 5-250 g/L sulfuric acid. The sulfur can be deposited in the anodic oxide coating. The anodic oxide 305 or the "craze resistant" oxide coating can include a sulfur content between about 13.5% and about 14.5% compared to the 16.5% of conventional Type II anodization coatings. Further, the nickel content is lower as well.

The increase in the coating's thermal exposure tolerance corresponds to a significantly increased fracture toughness of the coating (about 50% higher than a conventional Type II coating), which in turn is presumably due to reduced porosity. As noted above, the anodic oxide 305 or the "craze resistant" oxide coating has a mass of about 23 mg/dm$^2$ per micron of coating thickness, prior to sealing. In contrast, a conventional Type II coating has an unsealed coating mass of between about 11 mg/dm$^2$ and about 19 mg/dm$^2$ per micron of coating thickness. 11 mg/dm$^2$ being the lower specification limit and 19 mg/dm$^2$ being the upper specification limit for a Type III coating. As such, corresponding estimated porosities include ~26% for the oxide coating 305 and about 39% or more for Type II coatings. In other words, the porosity of the oxide coating 305 has been reduced by about one third compared to a conventional Type II coating. As evaluated by 40 kV XRF composition analysis, the anodic oxide 305 or the "craze resistant" oxide coating composition incorporates just 0.13 wt % Ni from a hot nickel acetate seal (5 wt % nickel acetate in DI water at 96° C. for 45 minutes), as compared to 0.2 wt % Ni or higher for a typical Type II coating. Again, it should be noted that these XRF values exclude oxygen, and therefore correspond to actual values of about 0.07 wt % in the anodic oxide 305 coating, compared to 0.10 wt % for a conventional Type II coating. This is further indicative of the significantly reduced porosity of the present coating. The hardness is 500+/−20 $HV_{0.05}$, as compared to the 320+/−20 $HV_{0.05}$ of a more typical Type II coating, again confirming the reduced porosity.

Figure 5:
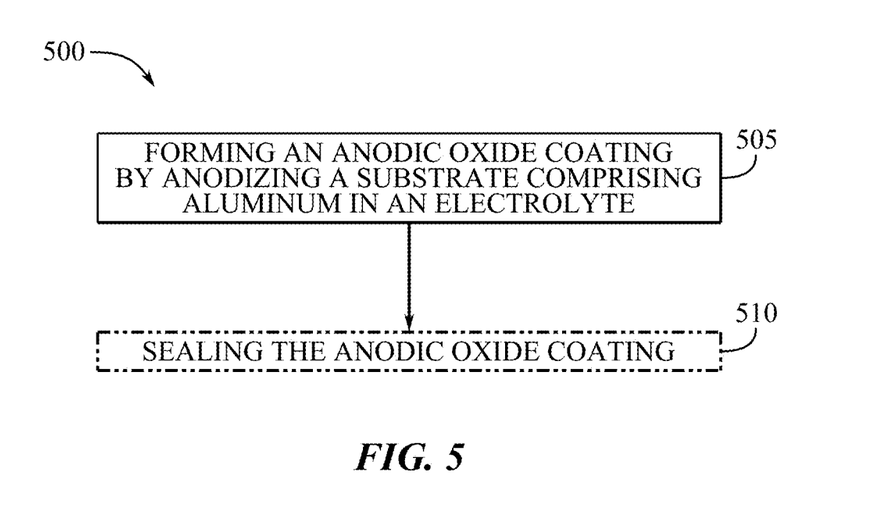
FIG. 5 shows a flowchart indicating method for forming an oxide coating, according to some examples.

FIG. 5 shows a flowchart indicating method 500 for forming an oxide coating, according to some examples. In some examples, method 500 can include act 505 of forming an anodic oxide coating by anodizing a substrate in an electrolyte. The substrate can include aluminum. In some examples, the anodic oxide can be formed by using a current density between about 1.0 A/dm$^2$ and about 2.0 A/dm$^2$. Higher currents may be used if the equipment permits, and if resulting discoloration is acceptable, but defects may be observed if the coating is formed at significantly higher current densities.

In some examples, a rate of dissolution of the anodic oxide coating during anodizing can be significantly lower in the lower sulfuric acid electrolytes than in conventional Type II electrolytes. This reduced rate of anodic oxide dissolution results in lower surface porosity and greater surface hardness of anodic oxide coating compared to anodic oxides formed to equivalent thicknesses in Type II electrolytes. In this way, the dilute sulfuric acid concentration electrolyte enables an anodizing process with results similar to more conventional Type II anodizing. That is, the resultant anodic oxide coating can be reasonably hard (i.e., ≥400 $HV_{0..05}$), porous oxide film, which is also well suited to dyeing and sealing processes. In some examples, the anodic oxide coating includes a porosity between about 21% and about 31%, which is between about 200 g/L and about 300 g/L.

In some examples, the anodic oxide formed can include a surface harness value of 450 $HV_{0.05}$ or greater. In some examples, the surface hardness value can be between about 450 $HV_{0.05}$ and about 550 $HV_{0.05}$. At thicknesses of 10 micrometers or less, contributions from the substrate hardness will have an influence on the measured surface hardness, and the measured value may not reflect the true, absolute hardness of corresponding bulk material. However, throughout this paper, quoted hardness values are measured in the same way, allowing meaningful comparisons of relative hardness values. The anodic oxide coating can include a thickness between about 5 µm and about 10 µm. Anodization can have a duration in a range from about 30 minutes to about 60 minutes, or from about 35 to about 55 minutes, or from about 40 to about 50 minutes, or can be about 45 minutes. The thickness of the oxide layer can be controlled in part by the duration of the anodization process.

In some examples, the electrolyte can include about 5-250 g/L sulfuric acid. In one example, a concentration of about 100 g/L sulfuric acid can be used. In some examples, the anodizing process can include using an electrolyte with dilute concentrations of sulfuric acid compared to Type II anodizing processes. In particular examples, the sulfuric acid concentration can be 70 g/L or less, and in some cases ranges between 5 g/L to 20 g/L. This can be compared to conventional Type II anodizing electrolytes that typically have sulfuric acid concentrations ranging between 10-20% by weight, or approximately 100 g/L to 200 g/L.

In some examples, the electrolyte can include about 5-100 g/L of organic acid. The organic acid can include at least one of oxalic acid, glycolic acid, tartaric acid, malic acid, citric acid, or malonic acid. In some examples, the electrolyte can include a mixture of about 100 g/L sulfuric acid and about 20 g/L of an organic acid. In some examples, a concentration of between about 10 g/L and about 30 g/L of and organic acid can be used. In a particular example, the total concentration of organic acid within the electrolyte can range between 10-100 g/L. In a further example, the electrolyte mixture is predominantly comprised of organic acid (20 g/L to 100 g/L) with sulfuric acid as a relatively minor additive (5 g/L to 20 g/L).

In some examples, adding an organic acid to the electrolyte can increase the hardness of the final anodic oxide coating. However, organic acids can also affect the appearance of the anodic oxide coating, such as give the anodic oxide coating a yellow, gold, bronze or brown hue depending on the type and amount of organic acid. Therefore, the use or organic acid and the type of organic acid will depend on various factors such as a desired final hardness and color of anodic oxide coating. In one example, oxalic acid added at a concentration of between 10-100 g/L can provide good hardness without too much discoloration. In some embodiments, an oxalic acid concentration of between 10-30 g/L can be used.

In some examples, other organic acids or mixtures of organic acids can be added to a dilute sulfuric acid electrolyte at similar concentrations. In a particular example, the sulfuric acid is added as a relatively minor additive (e.g., 5 g/L to 20 g/L) to an organic acid (at 20 g/L to 100 g/L), so as to reduce discoloration to negligible degree (i.e., each of a* and b*<1, as measured in accordance with CIE 1976 L*a*b* color space techniques), enabling the use of an organic acid (and the corresponding benefits of high hardness at low current density or high anodizing temperature, and minimal sulfate anion incorporation), without the usual problem of discoloration associated with anodizing in an organic acid.

For many cosmetic applications, anodic oxide coating formed in a dilute sulfuric acid electrolyte can exhibit uniform pore structure similar to anodic oxide coating using Type II anodizing. Thus, the anodic oxide coating is suitable for permeation by dyes or other colorants, making it possible to achieve a wide spectrum of colors through post-anodizing operations. Moreover, due to the reduced dissolving power of the electrolyte for the forming anodic oxide material of the anodic oxide coating during anodizing, the outermost surface of the anodic oxide coating can present an even more uniform pore structure in some examples than that of a film grown in Type II anodizing electrolyte at a given temperature. This ensures uniformity of color of the anodic oxide coating, even when a very light dye is applied.

A further possible benefit of the anodizing processes described herein is that they may reduce in-process corrosion of certain corrosion-sensitive alloys. In particular, the increased pH, reduced sulfate concentration, and possible inhibitive action of certain organic acids can all contribute to this benefit, as may the reduced potential or local over-potentials associated with anodizing at a lower applied voltage or current density.

Because the electrolyte includes a low concentration of sulfuric acid, the electrolyte can dissolve the anodic oxide film during the anodizing process at a lower rate than a conventional sulfuric acid electrolyte, which enables a porous film and/or coating to be developed in a manner similar to conventional Type II sulfuric acid anodizing, but with a lower porosity, resulting in a harder oxide coating, even when typical current densities of between about 1 A/dm$^2$ and about 2 A/dm$^2$ are used. Also, the anodic coating can be further processed at higher temperatures (up to and including about 120° C.), without compromising the metal oxide film surface hardness relative to conventional type II sulfuric acid (specifically, about 400 $HV_{0.05}$ hardness or greater measured on oxide coatings grown to about 10 micrometers thickness. Thus, the anodic oxide films can include sulfur concentrations of less than 4% by weight. This can be of particular benefit in avoiding a propensity for low interfacial adhesion of anodic oxides to 6000-series or 7000-series aluminum alloys (where zinc enrichment occurs at the oxide interface, combining with sulfur to weaken the interface).

The concentration of sulfuric acid of the electrolyte is sufficiently low to prevent formation of visually apparent defects using Type II anodizing electrolytes. That is, the anodized substrate is free of the scattered tiny pits observed on substrates anodized using Type II anodizing processes.

The anodizing temperature should be in the range typical of Type II anodizing, to avoid excessive reductive dissolution of the oxide as it forms and corresponding porosity and softening. In some examples, the anodizing temperature is less than about 20° C. Specifically, the anodizing temperature should not exceed 23° C. 20° C. is preferable and is used in the present work. Lower temperatures may be used, but these will adversely impact cosmetics of the oxide (making it darker and more discolored), and limit scope for color control with subsequent organic dyeing. The dyeing process can be similar to one used in a Type II anodic oxide coating. Any suitable coloring or dyeing process can be used, including organic dye infusion and/or electrolytic coloring.

Lower temperatures will also require higher applied voltages, making the process less well suited to typical Type II anodizing equipment with about a 25- or 30 -Volt range. In some examples, the method 500 can include anodizing in the sulfuric acid at a lower temperature of about 8° C. In some examples, a higher current density, such as 2.0 amps/dm$^2$ or higher can be used and also with a lower concentration of sulfuric acid. For example, a 100 g/L or lower can be used. This approach, however, utilizes equipment with higher chiller capacities and higher voltage or current outputs.

In some examples, the method 500 can further include act 510 of sealing the anodic oxide coating. The sealed oxide coating can include a nickel concentration no greater than 0.08% by weight. By way of example, act 510 of sealing the oxide coating can include sealing the pores of the oxide layer. This can include immersing the substrate and oxide coating in a sealing solution to seal pores in the oxide layer. In some examples, the sealing process can include immersing the oxide coating in about 5 wt % nickel acetate in deionized water at 96° C. for 45 minutes.

In some examples, the sealing process can include placing the surface in a solution for enough time to create a sealant layer that seals the pores. The sealing solution can include, but is not limited to, nickel acetate. The sealing solution can be kept at a temperature in a range from about 90 to about 100° C. The surface can be immersed in the solution for a period of at least 15 minutes. In some embodiments, the sealing can be performed using hot water or steam to convert a portion of the oxide layer into its hydrated form. This conversion allows the oxide layer to swell, thus reducing the size of the pores.

Additionally, any of the above methods can further include one or more further treatments on surface. For example, rinsing, degreasing, de-smutting, dyeing, sealing, polishing, texturizing, brightening, or further anodization can also be conducted.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services.

In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An enclosure for an electronic device, the enclosure comprising:
    a titanium-aluminum clad substrate; and
    an anodic oxide coating formed on the titanium-aluminum clad substrate, the anodic oxide coating comprising a porosity between about 21% and about 31% and a sulfur content between about 13.5% and about 14.5%.

2. The enclosure of claim 1, wherein the anodic oxide coating comprises a thickness between about 5 μm and about 10 μm.

3. The enclosure of claim 1, wherein the anodic oxide coating comprises a coating weight of at least 20 mg/dm² per micron of coating thickness.

4. The enclosure of claim 1, wherein:
    the anodic oxide coating is sealed with nickel acetate; and
    the anodic oxide coating comprises a nickel concentration no greater than 0.08% by weight.

5. The enclosure of claim 1, wherein the titanium-aluminum clad substrate comprises a 6000-series or 7000-series aluminum alloy.

6. The enclosure of claim 1, wherein the anodic oxide coating comprises a hardness value of at least 400 $HV_{0.05}$.

7. The enclosure of claim 1, wherein the anodic oxide coating is free of crazing after a thermal exposure of at least 150° C.

8. The enclosure of claim 1, wherein the enclosure further comprises a vapor deposition coating deposited on the titanium-aluminum clad substrate.

9. A housing, comprising:
    a substrate comprising aluminum; and
    an anodic oxide disposed on the substrate, the anodic oxide comprising a hardness value of 450 $HV_{0.05}$ or greater and having a sulfur content between about 13.5% and about 14.5%.

10. The housing of claim 9, wherein the substrate comprises an aluminum-titanium clad.

11. The housing of claim 9, wherein the anodic oxide is sealed with nickel acetate.

12. The housing of claim 9, wherein the anodic oxide has an a* of less than 1 and a b* of less than 1 as measured in accordance with CIE 1976 L*a*b* color space.

13. The housing of claim 9, wherein the anodic oxide comprises a density of about 2.3 g/cm3, or a coating mass of about 24 $mg/dm^{-2}\mu m^{-1}$.

* * * * *